United States Patent
Huang

(10) Patent No.: US 11,646,088 B2
(45) Date of Patent: May 9, 2023

(54) FLASH MEMORY PROGRAMMING CHECK CIRCUIT

(71) Applicant: SHANGHAI HUAHONG GRACE SEMICONDUCTOR MANUFACTURING CORPORATION, Shanghai (CN)

(72) Inventor: Mingyong Huang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 205 days.

(21) Appl. No.: 17/361,645

(22) Filed: Jun. 29, 2021

(65) Prior Publication Data
US 2022/0068411 A1    Mar. 3, 2022

(30) Foreign Application Priority Data
Aug. 31, 2020    (CN) .......................... 202010892503.X

(51) Int. Cl.
| G11C 7/00 | (2006.01) |
| G11C 16/34 | (2006.01) |
| G11C 16/10 | (2006.01) |
| G11C 16/24 | (2006.01) |
| G11C 16/26 | (2006.01) |
| G11C 16/30 | (2006.01) |
| G11C 16/32 | (2006.01) |

(52) U.S. Cl.
CPC ........ G11C 16/3459 (2013.01); G11C 16/102 (2013.01); G11C 16/24 (2013.01); G11C 16/26 (2013.01); G11C 16/30 (2013.01); G11C 16/32 (2013.01)

(58) Field of Classification Search
CPC ....... G11C 7/1078; G11C 7/22; G11C 7/1006; G11C 7/1096; G11C 7/1072
USPC .......................... 365/189.16, 189.11, 189.07
See application file for complete search history.

(56) References Cited

U.S. PATENT DOCUMENTS

| 6,421,757 B1 | 7/2002 | Wang et al. |
| 10,535,407 B2 * | 1/2020 | Wong ................. G11C 16/3459 |

(Continued)

FOREIGN PATENT DOCUMENTS

| CN | 105609142 A | 5/2016 |
| CN | 107871515 A | 4/2018 |

OTHER PUBLICATIONS

Search Report issued in corresponding Chinese Patent Application No. 202010892503X dated Aug. 26, 2022.

*Primary Examiner* — Son T Dinh
(74) *Attorney, Agent, or Firm* — Dilworth IP, LLC

(57) ABSTRACT

The present application relates to the technical field of memories, in particular to a flash memory programming check circuit, comprising: a memory cell, wherein a bit line is led out from the memory cell, and a pulse sequence signal with a gradually increasing voltage amplitude is applied to the bit line, so that during a high level period of the pulse sequence signal, the memory cell undergoes a program operation, and during a low level period of the pulse sequence signal, the memory cell undergoes a read detection operation; a pulse sequence generation unit used to generate the pulse sequence signal with a gradually increasing voltage amplitude to the bit line; and a reset unit used to control, when a programming control signal starts to be generated, a voltage of the bit line to drop.

8 Claims, 2 Drawing Sheets

(56) References Cited

U.S. PATENT DOCUMENTS

| | | | |
|---|---|---|---|
| 2008/0084751 A1* | 4/2008 | Li | G11C 16/3481 365/185.28 |
| 2012/0020167 A1 | 1/2012 | Lee et al. | |
| 2018/0090209 A1 | 3/2018 | Hong et al. | |

* cited by examiner

FLASH MEMORY PROGRAMMING CHECK CIRCUIT

CROSS-REFERENCES TO RELATED APPLICATIONS

This application claims priority to Chinese patent application No. CN 202010892503.X, filed at CNIPA on Aug. 31, 2020, and entitled "FLASH MEMORY PROGRAMMING CHECK CIRCUIT", the disclosure of which is incorporated herein by reference in entirety.

TECHNICAL FIELD

The present application relates to the field of memories, in particular to a flash memory programming check circuit.

BACKGROUND

The flash memory is a nonvolatile memory, the sector of which can undergo an erase operation and a program operation. When the erase operation is performed on the sector, all bits of the sector are erased to be in the state "1"; and when the program operation is performed on the sector, some bits of the sector are switched from the state "1" to the state "0". In addition, the erase operation needs to be performed before the program operation, such that all the bits are eased to be in the state "1".

In many cases, for example, when the flash memory is used in financial cards, the total time of the erase operation and program operation performed on one sector needs to be less than 1 ms. For this purpose, the means of reducing the time of the program operation is usually used to reduce the total time of the erase operation and the program operation.

However, since there is a difference in respective performance of storage elements that store binary numbers in a memory cell, when a unified program operation is performed on all the memory cells, a case of inconsistency in time taken by the charge quantities of floating gates of some storage elements to reach a target value may occur. That is, the charge quantities in some storage elements can reach the target value faster, while the charge quantities in some other storage elements reach the target value slower. The storage element in which the charge quantity reaches the target value faster is a storage element easier to be programmed, and the storage element in which the charge quantity reaches the target value slower is a storage element not easy to be programmed. When a read detection operation is performed on the memory cell by means of the related technology, the storage element on which the program operation is performed in a relatively difficult mode is easy to fail in being fully programmed, thereby resulting in a relatively large error in a read detection result.

BRIEF SUMMARY

The present application provides a flash memory programming check circuit, to solve the problem of a relatively large error in a read detection result resulting from a storage element not being completely programmed in the related art.

The present application provides a flash memory programming check circuit, the flash memory programming check circuit comprising:

a memory cell, wherein a bit line is led out from the memory cell, and a pulse sequence signal with a gradually increasing voltage amplitude is applied to the bit line, so that during a high level period of the pulse sequence signal, the memory cell undergoes a program operation, and during a low level period of the pulse sequence signal, the memory cell undergoes a read detection operation;

a pulse sequence generation unit used to generate the pulse sequence signal with a gradually increasing voltage amplitude to the bit line of the memory cell; and a reset unit used to control, when a programming control signal starts to be generated, a voltage of the bit line to drop.

Optionally, the pulse sequence generation unit comprises:

a charge pump module used to output a step wave with a gradually rising voltage; and a detection control module connected between an output end of the charge pump module and the bit line of the memory cell and used to perform periodical turn-off according to control of a detection control signal, to convert the input step wave with a gradually rising voltage into the pulse sequence signal with a gradually increasing voltage amplitude, and to output the pulse sequence signal with a gradually increasing voltage amplitude to the bit line.

Optionally, the charge pump module comprises:

a charge pump, the charge pump comprising an enable end, an output end, and a clock end;

a comparator, wherein a feedback end of the comparator is connected to the output end of the charge pump, and a reference end of the comparator is connected to a reference voltage signal; and a reference voltage generation module used to generate a stepped reference voltage signal with a gradually rising voltage and output the stepped reference voltage signal to the reference end of the comparator.

Optionally, the reference voltage generation module comprises:

a resistor string comprising a plurality of resistors sequentially connected in series, wherein one end of the resistor string is grounded, and the other end is connected to a power supply; and a connection node between two adjacent resistors is respectively connected to a communication end of a control switch, and the other communication ends of all the control switches are connected to one another and used as an output end of the reference voltage generation module.

Optionally, the comparator is used to output a stepped enable signal with a gradually rising voltage according to the reference voltage signal and an output signal of the charge pump; and the charge pump is used to output the step wave with a gradually rising voltage according to the stepped enable signal with a gradually rising voltage and a clock signal input from the clock end.

Optionally, the reset unit comprises:

a programming signal generation module used to generate and output a programming signal according to the programming control signal;

a MOS switch transistor, wherein the gate of the MOS switch transistor is connected to an output end of the programming signal generation module, and the drain of the MOS switch transistor is connected to the output end of the charge pump module; and a constant current source module, wherein the source of the MOS switch transistor is grounded via the constant current source module.

Optionally, when the programming control signal PROG starts to be generated, the programming signal Do controls the MOS switch transistor to be turned on, and an output end voltage of the charge pump module is pulled down.

Optionally, the programming signal generation module comprises a D flip-flop, and the D flip-flop comprises a reset end RST and an output end Q; and the reset end RST of the D flip-flop is connected to the programming control signal PROG via an inverter, and the output end Q of the D flip-flop is connected to the gate of the MOS switch transistor via an inverter.

The technical solution of the present application has at least the following advantages: the pulse sequence generation unit generates the pulse sequence signal with a gradually increasing amplitude to the bit line of the memory cell, so as to efficiently and accurately perform the program operation and read detection operation on the memory cell, such that a storage element can be fully programmed, avoiding the problems of an error and a difficulty in determination of a read detection result that are due to a difference in the performance of each storage element in the memory cell, and thereby reducing a read detection error.

BRIEF DESCRIPTION OF THE DRAWINGS

In order to more clearly explain the specific implementations of the present application or the technical solutions in the prior art, the drawings required in description of the specific implementations or the prior art will be briefly described below. It is obvious that the drawings described below are some implementations of the present application, and those skilled in the art could also obtain other drawings on the basis of these drawings involving any inventive skill.

DETAILED DESCRIPTION OF THE DISCLOSURE

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without involving any inventive skill shall fall into the protection scope of the present application.

In addition, the technical features involved in different embodiments of the present application described below can be combined with each other in the case of no conflict.

Figure 1:
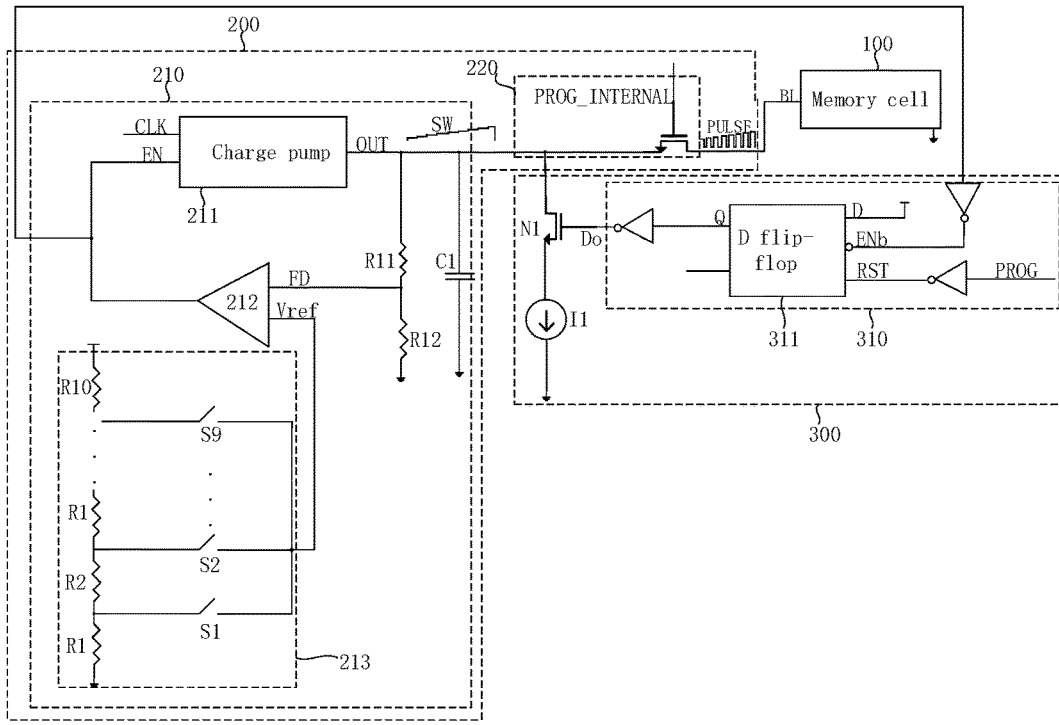
FIG. 1 illustrates a schematic diagram of a flash memory programming check circuit provided in an embodiment of the present application.
Figure 2:
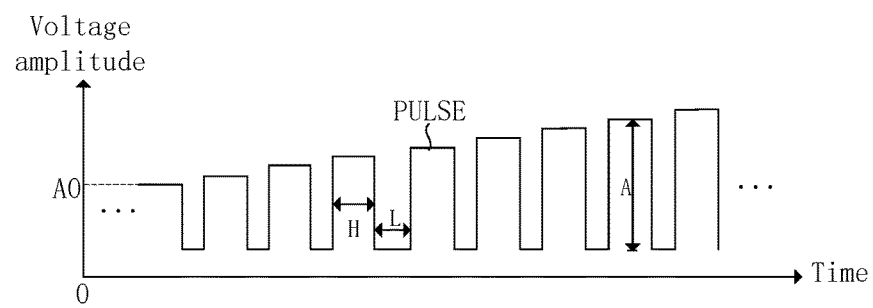
FIG. 2 illustrates an example timing diagram of a waveform of a pulse sequence signal in one cycle.

FIG. 1 illustrates a flash memory programming check circuit provided in an embodiment of the present application, referring to FIG. 1, the flash memory programming check circuit includes:

a memory cell 100, wherein a bit line BL is led out from the memory cell 100, and a pulse sequence signal PULSE with a gradually increasing voltage amplitude is applied to the bit line BL, so that during a high level period of the pulse sequence signal PULSE, the memory cell undergoes a program operation, and during a low level period of the pulse sequence signal PULSE, the memory cell undergoes a read detection operation; referring to FIG. 2 for a schematic diagram of the pulse sequence signal PULSE with a gradually increasing amplitude, FIG. 2 shows an example diagram of a waveform of the pulse sequence signal PULSE in one cycle, in this example, the pulse sequence signal PULSE includes 9 high level periods H and 8 low level periods L in one cycle, and the amplitude A of a pulse voltage of the pulse sequence signal PULSE formed in the high level periods H in one cycle gradually increases;

a pulse sequence generation unit 200, wherein the pulse sequence generation unit 200 is used to generate the pulse sequence signal PULSE with a gradually increasing amplitude; and a reset unit 300, wherein the reset unit 300 is used to control, at generation of a programming control signal PROG, a voltage of the bit line BL to drop to an initial pulse voltage amplitude A0 in a cycle of the pulse sequence signal PULSE, that is, at the generation of the programming control signal PROG, a new cycle of the pulse sequence signal PULSE starts.

Figure 3:
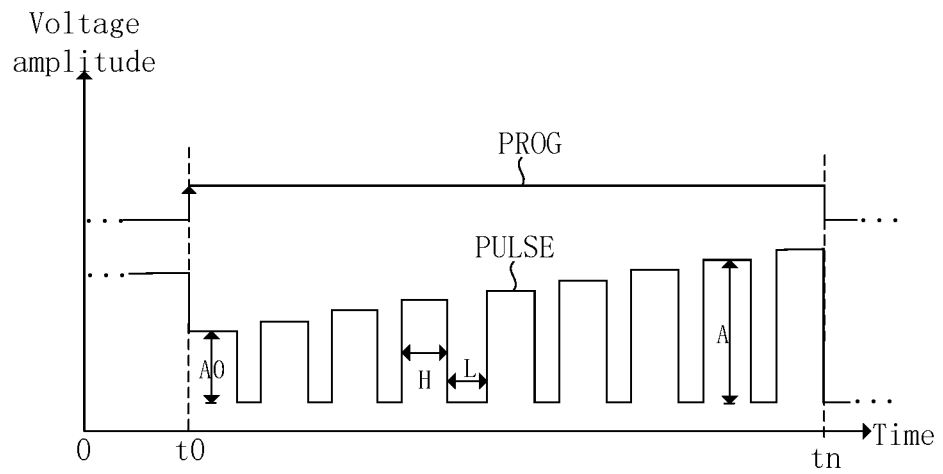
FIG. 3 illustrates a timing relationship diagram of a programming control signal and the pulse sequence signal.

FIG. 3 shows a timing diagram of the programming control signal PROG and the pulse sequence signal PULSE. A change in a relationship between the programming control signal PROG and the pulse sequence signal PULSE can be seen from FIG. 3. Referring to FIG. 3, it can be seen that from time t0 to time tn, the programming control signal PROG is generated. At time t0, the programming control signal PROG starts to be generated, and a new cycle of the pulse sequence signal PULSE starts, the pulse voltage amplitude A of the pulse sequence signal PULSE is pulled down to the initial pulse voltage amplitude A0 at this time, and the pulse voltage amplitude A of the pulse sequence signal PULSE gradually increases from the initial pulse voltage amplitude A0 at time t0.

Since there is a difference in performance of storage elements that store binary numbers in a memory cell, when a unified program operation is performed on the memory cell, a case of inconsistency in time taken by the charge quantity of a floating gate of each storage element to reach a target value may occur. That is, the charge quantities in some storage elements can reach the target value faster, while the charge quantities in some other storage elements reach the target value slower. The storage element in which the charge quantity reaches the target value faster is a storage element easier to be programmed, and the storage element in which the charge quantity reaches the target value slower is a storage element not easy to be programmed.

In order to enhance the effect of the program operation and reduce an error in flash memory programming check such that the charge quantity of each storage element can reach the target value efficiently during the program operation, the pulse sequence generation unit generates the pulse sequence signal with a gradually increasing amplitude to the bit line of the memory cell. During a high level period of the pulse sequence signal, the memory cell undergoes a program operation once, wherein during the program operation, the storage element is charged, and the charge quantity of a floating gate of the charged storage element increases. A low level period follows the high level period, and during the low level period, the memory cell undergoes a read detection operation, to read and detect binary data stored in each storage element of the memory cell after the previous program operation ends. If there is a storage element not easy to be programmed in the memory cell, which is not charged to a target value during the high level period, an error occurs in the subsequent read detection operation. After the detection error is determined, when a next high level period with a higher voltage amplitude comes, the program operation is performed again on the memory cell at a higher voltage, then the read detection operation is performed again in a subsequent low level period to determine whether a read detection result is correct, if the read detection result is correct, the detection on the memory cell stops, and if the read detection result is incorrect, the memory cell continues to undergo the program operation and the read detection operation via the pulse sequence signal with a gradually increasing amplitude.

In this embodiment, the pulse sequence generation unit generates the pulse sequence signal with a gradually increasing amplitude to the bit line of the memory cell, so as to efficiently and accurately perform the program operation and read detection operation on the memory cell, such that the storage element can be fully programmed, avoiding the problems of an error and a difficulty in determination of a read detection result that are due to a difference in the performance of each storage element in the memory cell, and thereby reducing a read detection error.

Continuing to refer to FIG. 1, the pulse sequence generation unit 200 shown in FIG. 1 includes:

a charge pump module 210, wherein the charge pump module 210 is used to output a step wave SW with a gradually rising voltage; and a detection control module 220, wherein the detection control module 220 is connected between an output end of the charge pump module 210 and the bit line BL of the memory cell and used to perform periodical turn-off according to control of a detection control signal PROG_INTERNAL, to convert the input step wave SW with a gradually rising voltage into the pulse sequence signal PULSE with a gradually increasing voltage amplitude, and to output the pulse sequence signal PULSE to the bit line BL.

Figure 4:
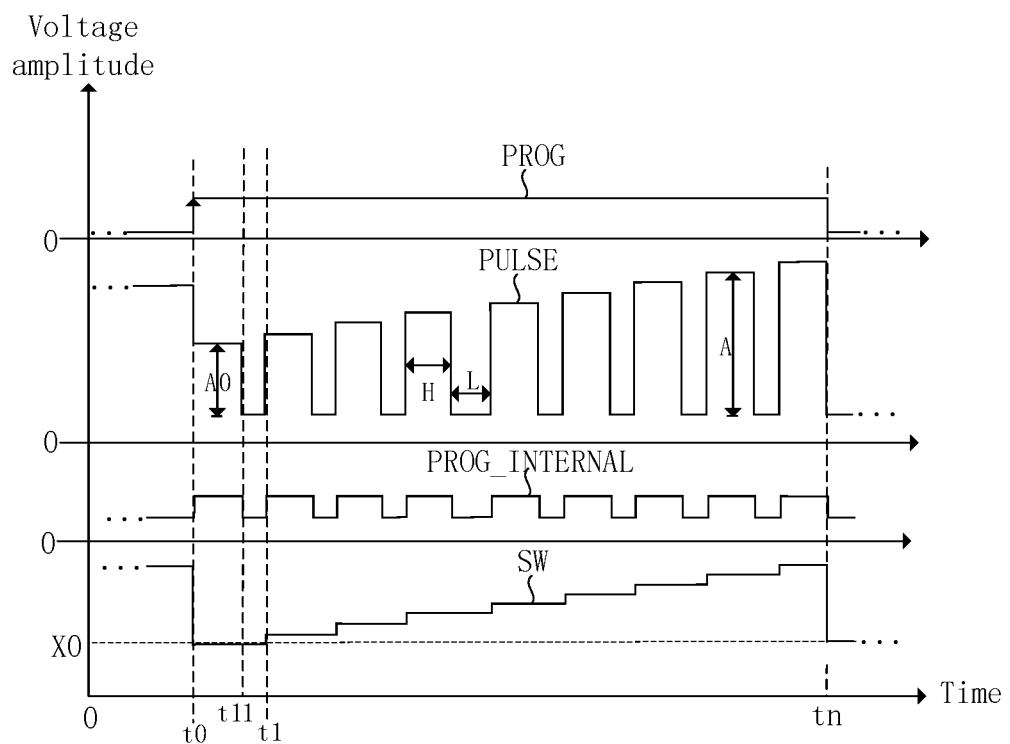
FIG. 4 illustrates a timing relationship diagram of a step wave, a detection control signal, the pulse sequence signal, and the programming signal.

FIG. 4 shows a timing relationship diagram of the step wave SW with a gradually rising voltage, the detection control signal PROG_INTERNAL, the pulse sequence signal PULSE, and the programming control signal PROG. Referring to FIG. 4, from time t0 to time tn, a timer generates the detection control signal PROG_INTERNAL, the detection control signal PROG_INTERNAL is a square wave signal, and a duty cycle of the detection control signal PROG_INTERNAL is the same as a duty cycle of the pulse sequence signal PULSE. At time t0, the programming control signal PROG starts to be generated, and a new cycle of the pulse sequence signal PULSE starts, the pulse voltage amplitude A of the pulse sequence signal PULSE is pulled down to the initial pulse voltage amplitude A0 at this time, and the pulse voltage amplitude A of the pulse sequence signal PULSE gradually increases from the initial pulse voltage amplitude A0 at time t0. Take a period (t0-t1) from time t0 to time t1 in FIG. 4 as an example. During the period t0-t1, a voltage of the step wave SW is X0, and during a period t0-t11 in the period t0-t1, the detection control signal PROG_INTERNAL is at a high level, in which case the detection control module is turned on, the output end of the charge pump module 210 communicates with the bit line BL of the memory cell 100 via the detection control module, and a bit line voltage is X0 and is transmitted to the bit line BL of the memory cell 100, that is, the high level period H of the pulse sequence signal PULSE is formed. During a period t11-t1, the detection control signal PROG_INTERNAL is at a low level, in which case the detection control module is turned off, the output end of the charge pump module 210 cannot communicate with the bit line BL of the memory cell 100, the bit line voltage is X0 and cannot be transmitted to the bit line BL of the memory cell 100, that is, the low level period L of the pulse sequence signal PULSE is formed. From time t0 to time tn, the above formation process is repeated, to convert the input step wave SW with a gradually rising voltage into the pulse sequence signal PULSE with a gradually increasing voltage amplitude, and to output the pulse sequence signal PULSE with a gradually increasing voltage amplitude to the bit line BL of the memory cell 100.

Continuing to refer to FIG. 1, the charge pump module 210 shown in FIG. 1 includes:

a charge pump 211, wherein the charge pump includes an enable end EN, an output end OUT, and a clock end CLK;

a comparator 212, wherein a feedback end FD of the comparator 212 is connected to the output end OUT of the charge pump 211, and a reference end Vref of the comparator 212 is connected to a reference voltage signal; and a reference voltage generation module 213, wherein the reference voltage generation module 213 is used to generate a stepped reference voltage signal with a gradually rising voltage and output the stepped reference voltage signal to the reference end Vref of the comparator 212.

The reference voltage generation module 213 include: a resistor string including a plurality of resistors sequentially connected in series, wherein one end of the resistor string is grounded, and the other end is connected to a power supply; and a connection node between two adjacent resistors is respectively connected to a communication end of a control switch, and the other communication ends of all the control switches are connected to one another and used as an output end of the reference voltage generation module. Referring to FIG. 1, the resistor string includes a plurality of resistors R1 to R10 sequentially connected in series, the connection node between two adjacent resistors is respectively connected to the communication end of the control switch, and the control switches are respectively S1, S2, ..., S9. According to the principle of resistive subdivision, different control switches output different voltages when turned on, so the stepped reference voltage signal with a gradually rising voltage can be formed when the control switches S1 to S9 are sequentially turned on.

The comparator 212 is used to output a stepped enable signal with a gradually rising voltage to the enable end EN of the charge pump 211 according to the reference voltage signal generated by the reference voltage generation module 213 and an output signal of the charge pump 211.

The charge pump 211 is used to output the step wave SW with a gradually rising voltage according to the stepped enable signal with a gradually rising voltage and a clock signal input from the clock end CLK.

Continuing to refer to FIG. 1, the reset unit 300 shown in FIG. 1 includes:

a programming signal generation module 310 used to generate and output a programming signal according to the programming control signal PROG, wherein the programming signal is output from an output end Do of the programming signal generation module 310, the programming signal generation module 310 includes a D flip-flop 311, the D flip-flop 311 includes a reset end RST, an enable end ENb, and an output end Q, the reset end RST of the D flip-flop 311 is connected to the programming control signal PROG via an inverter, the output end Q of the D flip-flop is connected to the gate of a MOS switch transistor N1 via an inverter, and the enable end EN of the charge pump 211 shown in FIG. 1 is connected to the enable end ENb of the D flip-flop;

the MOS switch transistor N1, wherein, exemplarily, the type of the MOS switch transistor N1 is NMOS, the gate of the MOS switch transistor N1 is connected to the output end Do of the programming signal generation module 310, the drain of the MOS switch transistor N1 is connected to the output end OUT of the charge pump module 210, and the MOS switch transistor N1 can be turned off or turned on according to the programming signal output from the output end Do of the programming signal generation module 310; and a constant current source module I1, wherein the source of the MOS switch transistor N1 is grounded via the constant current source module I1. When the programming control signal PROG starts to be generated, the programming signal controls the MOS switch transistor to be turned on, a voltage of the output end OUT of the charge pump module 210 is pulled down by means of a pull-down current generated by the constant current source module I1, thereby controlling the voltage of the bit line BL to drop to the initial pulse voltage amplitude in a cycle of the pulse sequence signal PULSE, that is, a new cycle of the pulse sequence signal PULSE starts at the generation of the programming control signal PROG.

It can be seen from the above description that, in the present application, the pulse sequence generation unit generates the pulse sequence signal with a gradually increasing amplitude to the bit line of the memory cell, so as to efficiently and accurately perform the program operation and read detection operation on the memory cell, such that the storage element can be fully programmed, avoiding the problems of an error and a difficulty in determination of a read detection result that are due to a difference in the performance of each storage element in the memory cell, and thereby reducing a read detection error.

Obviously, the above embodiments are merely examples used for clear description, rather than for limitation on the implementations. Those skilled in the art could also make other changes or modifications in different forms on the basis of the above description. There is no need and way to exhaustively list all of the implementations herein, but obvious changes or modifications derived herefrom still fall within the protection scope created by the present application.

What is claimed is:

1. A flash memory programming check circuit, the flash memory programming check circuit comprising:
    a memory cell, wherein a bit line is led out from the memory cell, and a pulse sequence signal with a gradually increasing voltage amplitude is applied to the bit line, so that during a high level period of the pulse sequence signal, the memory cell undergoes a program operation, and during a low level period of the pulse sequence signal, the memory cell undergoes a read detection operation;
    a pulse sequence generation unit used to generate the pulse sequence signal to the bit line; and
    a reset unit used to control, when a programming control signal starts to be generated, a voltage of the bit line to drop.

2. The flash memory programming check circuit according to claim 1, wherein the pulse sequence generation unit comprises:
    a charge pump module used to output a step wave with a gradually rising voltage; and
    a detection control module connected between an output end of the charge pump module and the bit line of the memory cell and used to perform periodical turn-off according to control of a detection control signal, to convert the input step wave with a gradually rising voltage into the pulse sequence signal with a gradually increasing voltage amplitude, and to output the pulse sequence signal with a gradually increasing voltage amplitude to the bit line.

3. The flash memory programming check circuit according to claim 2, wherein the charge pump module comprises:
    a charge pump, the charge pump comprising an enable end, an output end, and a clock end;
    a comparator, wherein a feedback end of the comparator is connected to the output end of the charge pump, and a reference end of the comparator is connected to a reference voltage signal; and
    a reference voltage generation module used to generate a stepped reference voltage signal with a gradually rising voltage and output the stepped reference voltage signal to the reference end of the comparator.

4. The flash memory programming check circuit according to claim 3, wherein the reference voltage generation module comprises:
    a resistor string comprising a plurality of resistors sequentially connected in series, wherein one end of the resistor string is grounded, and the other end is connected to a power supply; and a connection node between two adjacent resistors is respectively connected to a communication end of a control switch, and the other communication ends of all the control switches are connected to one another and used as an output end of the reference voltage generation module.

5. The flash memory programming check circuit according to claim 3, wherein the comparator is used to output a stepped enable signal with a gradually rising voltage according to the reference voltage signal and an output signal of the charge pump; and
    the charge pump is used to output the step wave with a gradually rising voltage according to the stepped enable signal with a gradually rising voltage and a clock signal input from the clock end.

6. The flash memory programming check circuit according to claim 2, wherein the reset unit comprises:
    a programming signal generation module used to generate and output a programming signal according to the programming control signal;
    a MOS switch transistor, wherein the gate of the MOS switch transistor is connected to an output end of the programming signal generation module, and the drain of the MOS switch transistor is connected to the output end of the charge pump module; and
    a constant current source module, wherein the source of the MOS switch transistor is grounded via the constant current source module.

7. The flash memory programming check circuit according to claim 6, wherein when the programming control signal starts to be generated, the programming signal controls the MOS switch transistor to be turned on, and an output end voltage of the charge pump module is pulled down.

8. The flash memory programming check circuit according to claim 6, wherein the programming signal generation module comprises a D flip-flop, and the D flip-flop comprises a reset end and an output end; and
    the reset end of the D flip-flop is connected to the programming control signal via an inverter, and the output end of the D flip-flop is connected to the gate of the MOS switch transistor via an inverter.

* * * * *